Feb. 21, 1961 W. R. SANER ET AL 2,972,540

PHOTOPOLYMERIZABLE COMPOSITIONS AND ELEMENTS

Filed Aug. 5, 1958

INVENTORS
WILLIAM RUSSELL SANER
MARION BURG
BY Lynn Barratt Morris
ATTORNEY

United States Patent Office 2,972,540

Patented Feb. 21, 1961

2,972,540

PHOTOPOLYMERIZABLE COMPOSITIONS AND ELEMENTS

William Russell Saner, Scotch Plains, and Marion Burg, Metuchen, N.J., assignors to E. I. du Pont de Nemours and Company, Wilmington, Del., a corporation of Delaware Filed Aug. 5, 1958, Ser. No. 753,344

12 Claims. (Cl. 96—115)

Figure 1:

This invention relates to photopolymerizable compositions and elements embodying a solid synthetic linear polyamide containing extralinear N-acrylyloxymethyl groups including those having a substituent on the α-carbon atom of the acrylyl radical. More particularly, the invention relates to such compositions and elements embodying such an amide which is soluble to the extent of at least 15% by weight in ethanol and in ethanol/water mixtures containing up to about 30%, by weight, of water, an addition-polymerization initiator and, if desired, a compatible addition-polymerizable compound. The invention also relates to processes of making line and halftone printing reliefs by photopolymerization of such elements.

Various solid compositions and layers of photopolymerizable elements capable of addition polymerization under the influence of actinic light to give rigid, insoluble tough structures, and particularly reliefs suitable for direct use as printing reliefs, are disclosed in Plambeck U.S. Patent 2,760,863 and divisional application Ser. No. 541,723 filed Oct. 20, 1955 (U.S. Patent No. 2,791,504) which claims photopolymerizable elements.

An object of this invention is to provide new specific photopolymerizable elements of the general type disclosed in the Plambeck patent. Another object is to provide alternative photopolymerizable elements which are useful in the processes for making printing reliefs covered by said Plambeck patent. Another object is to provide such elements which yield strong, sharp, tough printing reliefs. A further object is to provide such elements which yield such reliefs which are unaffected by the usual printing inks and solvents therefor and printing plate cleaning fluids. A still further object is to provide commercial uses for solvent-soluble laterally unsaturated polyamides. A still further object is photopolymerizable elements for making printing reliefs whereby the unexposed portions of the layers can be readily and completely removed by means of ethanol or ethanol/water solutions. Still other objects will be apparent from the following description of the invention.

It has been found that the above objects can be attained and commercially practical photopolymerizable compositions and elements suitable for the preparation of printing reliefs provided by this invention. The novel photopolymerizable compositions comprise (1) a soluble intralinear polyamide having extralinear N-acrylyloxymethyl groups, at least 80% by weight of the polymer consisting of recurring intralinear units having a unit length of at least 7, where "unit length" is defined as in U.S. Patents 2,071,253 and 2,130,948, and (2) a small amount, e.g., 0.01 to 5.0%, or more, of an addition-polymerizable initiator activatable by actinic light.

Polyamide units of the unsaturated linear polyamides referred to in the preceding paragraph contain recurring amide groups of the formula:

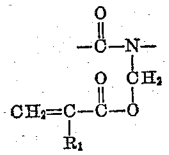

wherein $R_1$ is hydrogen, an alkyl radical of 1 to 5 carbon atoms or halogen, e.g., chlorine. In the preferred compounds $R_1$ is hydrogen or methyl. The laterally unsaturated group will be present on at least 2% up to about 42% of the intralinear amido nitrogen atoms, i.e., those which carried the N-alkoxymethyl groups, any remaining substituents being alkoxymethyl groups.

The novel unsaturated polyamides used in the compositions and elements of this invention constitute the subject matter of assignee's related application Serial No. 628,978 filed December 18, 1956. These polyamides can be made by reacting (1) a water-soluble N-alkoxymethyl polyamide containing alkoxymethyl groups on 10% to 45% of the amido nitrogen atoms and preferably one wherein said alkoxy radical contains 1 to 5 carbon atoms with (2) an esterifying agent containing a radical of the formula

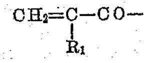

wherein $R_1$ is hydrogen, an alkyl radical of 1 to 5 carbon atoms, e.g., methyl, ethyl, propyl and halogen; e.g., acrylic or α-alkylacrylic acid, and α-chloroacrylic acid, or the corresponding acid chlorides or bromides or anhydrides, in the presence of (3) a small amount of an inhibitor of thermal addition polymerization and a solvent or diluent, if necessary or desired, for a period sufficient to introduce extralinear unsaturated groups into the polyamide. The reaction can be carried out at practical speeds at temperatures above 40° C. and generally less than 80° C. and usually requires from 40 minutes to 2 hours. The resulting unsaturated polyamide is separated from the reaction medium, washed with the precipitant, e.g., acetone, etc., filtered, and dried. The unsaturated polyamide, which is usually a white solid, is soluble to the extent of at least 15% by weight in ethanol or water/ethanol mixtures containing up to about 30%, by weight of water. The polyamide, moreover, is insoluble in chlorinated hydrocarbon solvents, e.g., chloroform, carbon tetrachloride, trichloroethylene.

N-alkoxymethyl polyamides and polyesteramides suitable for making the unsaturated polyamides described above are described in U.S. Patents 2,393,972, 2,412,993, 2,340,860 and 2,430,866. In general, they are prepared by reacting (*a*) a linear polycarbonamide of high molecular weight containing hydrogen-bearing amide groups as an integral part of the main polymer chain with (*b*) formaldehyde, and (*c*) a formaldehyde-reactive organic compound having hydrogen attached to an element of groups V and VI of series 2 and 3 of the periodic table, particularly an alcohol or mercaptan, in the presence of a catalyst consisting essentially of oxygen-containing acid having an ionization constant at least as great as $9.6 \times 10^{-6}$ and an equivalent conductance, measured at 25° C. in 0.01 N concentration, no greater than 370 $ohms^{-1}.cm.^2$. In general, formaldehyde is used in an amount from 50 to 100% by weight of the polycarbonamide, and the alcohol in an amount from 1 to 2 moles per mole of formaldehyde and the reaction mixture heated to between 30° C. and 100° C. until at least 10% to 45% of the hydrogen-bearing amide groups have undergone reaction to form alkoxymethyl groups.

The unsaturated polyamides produced by converting the alkoxy groups of the alkoxy polycarbonamides to unsaturated ester groups by the process of this invention may vary widely in molecular weight, e.g., from about 5,000 to more than 50,000. These laterally unsaturated polyamides, in general, have a molecular weight in excess of 10,000 and an intrinsic viscosity (as defined in U.S.P. 2,130,948) of at least 0.4.

Useful addition-polymerizable compounds which are compatible with the N-acrylyloxymethyl polyamides and can be used in the compositions, elements and processes of this invention include glycerol dimethacrylate, hydroxyethyl methacrylate, and bis(2-methacrylamidoethyl) amide.

By compatibility is meant the ability of two or more constituents to remain homogeneously dispersed in one another. Some slight haze of the layer before or during exposure can be tolerated but in the case of fine detail preferably is avoided. The above compatible compounds form high molecular weight addition polymers rapidly by photoinitiated addition polymerization in the presence of an addition-polymerization initiator.

The solid photopolymerizable compositions of this invention, exclusive of the initiator, are essentially transparent to actinic light. When an initiator is present, however, the composition absorbs the actinic light and energy required to initiate the photopolymerization. In order to secure an essentially transparent mixture, the polyamide component should be compatible with, and preferably soluble in, the accompanying addition polymerizable component when such component is used. The composition, inclusive of the initiator, in the form of a layer from 3 to 250 mils in thickness, when to be polymerized throughout the layer in a short time, preferably has a density to actinic light of less than 5.0 and less than 0.5 per mil of thickness.

The photopolymerizable elements of this invention can be made by casting or extruding a solution or dispersion of the photopolymerizable composition into the form of a layer on a suitable casting wheel or belt or as a self-supporting sheet which layer or sheet is then affixed to the surface of a suitable permanent support by means of a suitable adhesive, if necessary, or the solution or dispersion may be coated onto a suitable support. The support may contain an antihalation material or have a layer or stratum of such material on one or both surfaces. The elements may be made in the various manners described in Plambeck U.S. Patent 2,760,863.

Suitable base or support materials include metals, e.g., steel and aluminum plates, sheets and foils, and films or plates composed of various film-forming synthetic resins or high polymers, such as addition polymers, including those mentioned later, in both monomeric and polymeric form for use in the photopolymerizable layer and in particular the vinylidene polymers, e.g., the vinyl chloride polymers, vinylidene chloride copolymers with vinyl chloride, vinyl acetate, styrene, isobutylene and acrylonitrile; and vinyl chloride copolymers with vinyl acetate, styrene, isobutylene, and acrylonitrile; the linear condensation polymers such as the polyesters, e.g., polyethylene terephthalate; the polyamides, e.g., polyhexamethylene sebacamide; polyester amides, e.g., polyhexamethylene adipamide/adipate; etc. Fillers or reinforcing agents can be present in the synthetic resin or polymer bases such as the various fibers (synthetic, modified, or natural), e.g., cellulosic fibers, for instance, cotton, cellulose acetate, viscose rayon, paper; glass wool; nylon, and the like. These reinforced bases may be used in laminated form.

Figure 2:
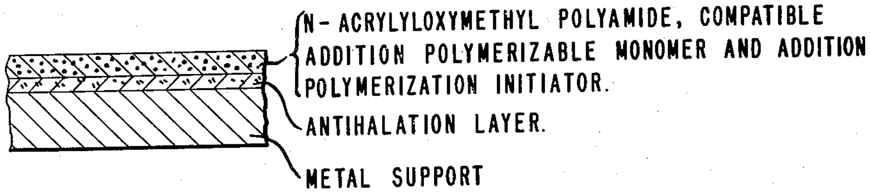

While the structures of the photopolymerizable elements of this invention are apparent from the descriptions given above and below, for convenience representative elements are set forth in the attached drawing which constitutes a part of this application wherein:

Fig. 1 is a vertical cross-sectional view of one type of photopolymerizable element of this invention, and Fig. 2 is a vertical cross-sectional view of an alternative element.

Printing reliefs can be made in accordance with this invention by exposing to actinic light selected portions of a photopolymerizable layer of an element described above, e.g., through an image-bearing transparency or stencil having areas essentially transparent to actinic light of substantially uniform optical density and areas opaque to actinic light of substantially uniform optical density until addition polymerization is essentially complete, i.e., to the insoluble state, in the exposed portions or areas with no signficant polymerization in the unexposed portions or areas and removing unexposed portions of the layer by means of a solvent for the N-acrylyloxymethyl polyamide. During the addition polymerization, cross-linking occurs and the N-acrylyloxymethyl polyamide is converted to the insoluble state, i.e., insoluble in ethanol and ethanol/water mixtures.

The invention will be further illustrated by, but is not to be limited to, the following examples:

*Example I*

A mixture of 20 g. N-methoxymethyl polyhexamethylene adipamide having an intrinsic viscosity of about 1 and having methoxymethyl groups on at least 45% of the amido nitrogen atoms, 0.4 g. di-tert-butyl p-cresol, 40 ml. methacrylic acid, 80 ml. chloroform, and 15 ml. methacrylic anhydride was heated, with stirring, on a steam bath at 60–71° C. for 1 hour. The resulting polyamide was isolated by precipitating and washing with acetone and dried in air to yield 18.5 grams of a white, fluffy solid, N-methacrylyloxymethyl polyhexamethylene adipamide having methacrylyl groups on about 35% and methoxymethyl groups on about 10% of the intralinear amido nitrogen atoms. This solid polymer was dissolved in 80 ml. ethanol by stirring at 50–60° C. for 40 minutes. It was filtered hot through nainsook, 0.19 g. benzoin methyl ether dissolved in a small amount of ethanol was added, and the mixture was stirred for 5 minutes at 45–50° C. The hot solution was cast on a glass plate provided with a narrow paper dam to prevent the solution from running over the edges of the plate. It was allowed to evaporate in the dark for 7 days. A clear, tough, flexible film about 70 mils (1.8 mm.) thick was formed. A portion of the sheet was bonded to an aluminum base 15 mils (0.38 mm.) thick by means of the "Scotch-Weld" adhesive made by the Minnesota Mining and Manufacturing Co. (a butadiene/acrylonitrile copolymer combined with a phenol-formaldehyde resin). The adhesive, a yellowish-brown material, also served as an antihalation layer. Its light transmission is 0 at wave lengths less than 440 mμ and, at wave lengths from 450 to 550 mμ, is in accordance with the following table:

| λ(mμ): | Percent transmission |
|---|---|
| 450 | 0.1 |
| 460 | 0.1 |
| 470 | 1.3 |
| 480 | 3.0 |
| 490 | 6.1 |
| 500 | 9.0 |
| 510 | 12.1 |
| 530 | 17.8 |
| 550 | 23.1 |

The photopolymerizable plate thus prepared was exposed in a vacuum frame to a 2000-watt high-pressure mercury-arc lamp through a process negative containing a letter-text image for 7 minutes at a distance of 6 inches. The exposed plate was developed for 15 minutes in ethanol at 40–45° C. and a sharply defined relief image of such text was obtained.

*Example II*

A mixture of 15 g. N-methoxymethyl polyhexamethylene adipamide having an intrinsic viscosity of about 1 and having methoxymethyl groups on at least 45% of the amido nitrogen atoms, 75 ml. acrylic acid, and 0.30 g. hydroquinone was stirred at room temperature for 15 minutes and then placed in an oil bath preheated to 130° C. After 20 minutes, during which time the reaction temperature reached 75–80° C., the solution was cooled to 60° C., and a white fibrous solid polyamide was precipitated upon addition to 500 ml. acetone. The polyamide was slurried with three 300 ml. portions of acetone, pulverized in a high-speed comminuting and blending apparatus (U.S. Patent 2,109,501) with three 350 ml. portions of acetone, and washed with 150 ml. acetone after each pulverizing treatment. After the material was dried in air, 14 g. of white powder, N-acrylyloxymethyl polyhexamethylene adipamide, was obtained. A solution of 2 g. of the polyamide thus obtained in 20 ml. of ethanol containing 0.02 g. benzoin methyl ether as a photoinitiator was poured on a glass plate to a depth of 200 mils (5.1 mm.), a narrow dam around the periphery of the plate preventing the solution from flowing off, and allowed to evaporate at room temperature to give a photosensitive layer about 20 mils in thickness. The dry sheet was bonded to a 15-mil (0.38 mm.) sheet of aluminum as in Example I and exposed for 25 minutes at 65° C. under a process negative having a lettertext image in a vacuum frame to ultraviolet radiation from twenty 30-watt fluorescent lamps placed at a distance of six inches from the plate. A relief image was obtained upon development in ethanol at 45° C.

*Example III*

To a stirred mixture of 80 g. N-methoxymethylpolyhexamethylene adipamide having an intrinsic viscosity of about 1 and having methoxymethyl groups on at least 45% of the amido nitrogen atoms, 1.6 g. di-tert-butyl p-cresol, and 160 ml. methacrylic acid there were added 200 ml. chloroform and 60 ml. methacrylic anhydride. The mixture was heated on a steam bath at 68° C. for one hour. The solution was cooled, and the unsaturated polyamide was precipitated by slowly adding 1.5 liters of acetone. The resulting white and swollen polyamide was isolated by decanting the fluid through nainsook; it was purified by slurrying twice with acetone, one liter of acetone being used each time, and once with diethyl ether. It was then dried in air to yield 75 g. of white, fluffy solid, N-methacrylyloxymethyl polyhexamethylene adipamide having methacrylyl groups on at least 35% and methoxymethyl groups on about 10% of the intralinear amido nitrogen atoms. To a filtered solution of 30 g. of the N-methacrylyloxymethyl polyhexamethylene adipamide thus prepared and 15 g. glycerol dimethacrylate in 160 ml. ethanol there was added 0.45 g. benzoin methyl ether. The solution was cast on a glass plate provided with a narrow paper dam near its periphery to prevent the solution from running over the edges of the plate. It was allowed to evaporate in the dark for several days. The resulting clear, tough, flexible film about 60 mils thick was bonded to an aluminum support 15 mils thick by brushing a 33% solution of 2,2′-dihydroxy-4,4′-dimethoxybenzophenone, an antihalation agent, in acrylic acid on one side of the polymer sheet and pressing this side to the aluminum surface at about 60 lbs./sq. in. at 100° C. for 2 to 3 minutes. The resultant photopolymerizable plate was exposed for 10 minutes at 60° C. in a vacuum frame under a process negative containing a letter-text image to a 2000-watt high-pressure mercury-arc lamp at a distance of 6 inches. The exposed plate was developed by washing with ethanol at 40–45° C. for 3 minutes. The unexposed, still soluble portions of the polyamide film were readily removed, and a sharp, firm image 60 mils deep was obtained which was used for printing on a flat bed press.

The press performance of plates prepared in accordance with this example was tested by subjecting small squares of printing reliefs made by this procedure to accelerated wear tests. Multiple specimens of the squares were mounted accurately on the press cylinder of a rotary press. The press was run to make 5000 impressions on an abrasive paper with a special abrasive ink containing barytes. Control runs were made with specimens of copper electrotype printing reliefs. The amount of wear was measured for each specimens of this example, and the average was found to be 1.9 mils. The copper electrotype under the same conditions of test showed an average wear of 2.1 mils.

*Example IV*

To a filtered solution of 30 g. of the N-methacrylyloxymethyl polyhexamethylene adipamide prepared in accordance with Example III and 10 g. glycerol dimethacrylate in 152 ml. ethanol there was added 0.40 g. benzoin methyl ether. The solution was cast, mounted, exposed, and developed as described in Example III. A relief image suitable for direct use as a printing plate was obtained.

*Example V*

When the N-methacrylyloxymethyl polyhexamethylene adipamide of Example III was combined with hydroxyethyl methacrylate, a good solvent for the N-methacrylyloxymethyl polyhexamethylene adipamide, in a ratio of 2 parts by weight of polyamide to 1 part of hydroxyethyl methacrylate, and a photoinitiator, e.g., benzoin methyl ether, formed into a sheet 30 mils thick when dry, and mounted, exposed, and developed as in Example III, a hard, sharp-edged relief suitable for direct use as a printing plate was obtained.

*Example VI*

Example V was repeated, except that the ratio of polyamide to plasticizer was 2/0.5. A hard, sharp-edged photopolymer relief suitable for direct use as a printing plate was obtained in this case also.

*Example VII*

To a filtered solution of 20 g. of the N-methacrylyloxymethyl polyhexamethylene adipamide prepared in accordance with Example III in 146 ml. ethanol was added 0.30 g. benzoin methyl ether and 10 g. bis(2-methacrylamidoethyl)amine. The solution was cast on a glass plate to a tough, flexible film about 72 mils thick. The film was pressed between spacers to a thickness of 48 mils at 3000 lb./sq. in. at 125° C. for 1 minute. The resulting clear film was bonded to an aluminum plate 17 mils thick provided with an amorphous surface coating 0.005 to 0.01 mil thick of a mixed metallic oxide-chromate (Alodized aluminum produced by the American Chemical Paint Co., Ambler, Pa.) which was dyed with a mixture of 87% Tartrazine (C.I. 640) and 13% Azorubin (C.I. 179) to form a yellow antihalation coating having a reflection density determined in the Cary spectrophotometer, of 0.97 at 3000 A. and 0.90 at 4000 A. The bonding was accomplished by brushing acrylic acid on one side of the film and pressing this side to the treated aluminum surface at 180 lb./sq. in. at 85° C. for 2 minutes. The resultant photopolymerizable plate was exposed for 10 minutes at 60° C. in a vacuum frame under a process negative containing a lettertext image to actinic light rays from a 2000-watt high-pressure mercury lamp mounted in a parabolic reflector, said lamp being at a distance of 6 inches from said plate. The exposed plate was developed by washing with ethanol at 40–45° C. for 3 minutes. A hard, sharp-edged relief image 30 mils thick was obtained which when used for printing on a flat bed press resulted in a sharp, uniform printed text.

The photopolymerizable layers of the preceding examples are essentially transparent to actinic light as may be seen from the following tabulation of optical densities of typical compositions:

| Composition | Thickness in mils | Wave Length in A. | Optical Density |
|---|---|---|---|
| N-methacrylyloxymethyl polyhexamethylene adipamide containing 1% by weight of benzoin methyl ether | 22 | 3,200<br>3,600<br>4,000 | 1.26<br>0.58<br>0.13 |
| 2 parts by weight of N-methacrylyloxymethyl polyhexamethylene adipamide and 1 part by weight of glycerol dimethacrylate containing 1% by weight of the total composition of benzoin methyl ether | 16 | 3,200<br>3,600<br>4,000 | 1.99<br>0.46<br>0.14 |
| 2 parts by weight of N-methacrylyloxymethyl polyhexamethylene adipamide and 1 part by weight of glycerol dimethacrylate containing 1% by weight of the total composition of benzoin methyl ether | 25 | 3,200<br>3,600<br>4,000 | 1.78<br>1.00<br>0.28 |

In place of the specific synthetic linear N-acrylyloxymethyl polyamides of the foregoing examples, there can be substituted in like amount, or in the amounts specified above, other polyamides described above or obtainable from the reactants listed in the aforesaid application Ser. No. 628,978.

The water-soluble N-alkoxymethyl polyamide reactants, as stated above, may contain alkoxymethyl groups on about 10% to about 45% of the amido nitrogen atoms. Upon being reacted with the acrylyl or alpha-alkacrylyl halides, the reactants are converted to N-acrylyloxymethyl and N-(alpha-alkacrylyloxy)methyl polyamides in which at least 2% up to about 42% of the intralinear amido nitrogen atoms have attached thereto the N-acrylyloxymethyl and N-(alpha-alkacryloloxy)methyl groups. The unreplaced N-alkoxymethyl groups remain as such in the converted polyamides. In the case of an N-alkoxymethyl polyamide containing 10% alkoxymethyl groups, the converted unsaturated polyamides can contain N-acrylyloxymethyl or N-methacrylyloxymethyl groups, for example, on 2 to 10% of the amido nitrogen atoms and N-alkoxymethyl groups on 8% to 0% of the intralinear nitrogen atoms.

As stated above and illustrated in Examples III, IV, V, VI and VII, there may be present in the photopolymerizable compositons containing the laterally unsaturated polycarbonamides compatible addition - polymerizable ethylenically unsaturated compounds. These latter compounds, e.g., glycerol dimethacrylate, hydroxyethyl methacrylate and bis(2-methacrylamidoethyl)amine, can be present in amounts from 1 to 60% and preferably 30 to 60% by weight of the total photopolymerizable composition.

Practically any initiator of addition polymerization which is capable of initiating polymerization under the influence of actinic light can be used in the photopolymerizable compositions of this invention. Because transparencies transmit both heat and light and the conventional light sources give off heat and light, the preferred initiators should not be active thermally at temperatures below 85° C. They should be dispersible in the compositions to the extent necessary for initiating the desired polymerization under the influence of the amount of light energy absorbed in relatively short-term exposures. These initiators are useful in amounts from 0.01% to 5% or more and preferably from 0.01% to 2.0% based on the weight of the total polymerizable composition.

Suitable photopolymerization initiators or catalysts include vicinal ketaldonyl compounds, e.g., diacetyl, benzil, etc.; α-ketaldonyl alcohols, e.g., benzoin, pivaloin, etc.; acyloin ethers, e.g., benzoin methyl or ethyl ethers; azonitriles, e.g., 1,1'-azadicyclohexane carbonitrile; α-hydrocarbon-substiuted aromatic acyloins including α-methylbenzoin and α-allylbenzoin (U.S. Patent 2,722,512); O-alkyl xanthate esters of the type described in U.S. Patent 2,716,633.

As previously indicated, an important aspect of the present invention comprises photopolymerizable elements suitable for the preparation of letterpress prinitng reliefs by the processes described in Plambeck U.S. Patent 2,760,863. The thickness of the photopolymerizable layer in general is a direct function of the thickness desired in the relief image and this will depend on the subject being reproduced and particularly on the extent of the non-printing areas. In the case of photopolymerized halftones, the screen used also is a factor. In general, the thickness of the polymerizable layer on the base plate will vary from 3 to 250 mils. Layers ranging from 3 to 60 mils in thickness will be used for the majority of letterpress printing plates. Layers thicker than 50 to 60 mils can be used for the printing of designs and relatively large areas in letterpress printing plates.

The photopolymerizable layers may also, if desired, include compatible plasticizers, other unsaturated monomers, and polymers. Such agents may be used to improve the rate or extent of the cross-linking throughout the photopolymerizable layer and to facilitate the removal of the unexposed areas.

The photopolymerizable layers can also contain immiscible polymeric or non-polymeric organic or inorganic fillers or reinforcing agents which are essentially transparent, e.g., the organophilic silicas, bentonites, silica, powdered glass, etc., having a particle size less than 0.4 mil and in amounts varying with the desired properties of the photopolymerizable layer.

Even when containing plasticizers and monomeric additives as described above, the photopolymerizable compositions of this invention are solids. While their hardness varies, in the form of flexible sheets their surfaces are substantially non-deformable under ordinary conditions, and generally are non-tacky. Thus, they offer considerable physical advantages over photopolymerizable compositions obtained as liquids, viscous liquids or flowable gels, from the standpoint of forming them into convenient elements for commercial printing use.

The photopolymerizable compositions of this invention can be prepared in many ways from the constituents specified above, i.e., (A) a soluble N-acrylyloxymethyl polyamide, (B) an addition-polymerization initiator activatable by actinic light (preferably free-radical-generating) and, if desired, (C) a compatible ethylenically unsaturated, addition-polymerizable component, including, if desired, the admixtures mentioned above, by mixing them in any order, and, if desired, with the aid of a solvent, e.g., methanol, water-ethanol mixtures, etc. Conventional milling, mixing, and solution techniques can be applied, the particular technique varying with the differences in properties of the respective components. The homogeneous, essentially transparent compositions are formed into sheets in any desired manner. For example, solvent-casting, milling, or extrusion are suitable methods for preparing layers of the desired thickness.

Actinic light from any source and of any type can be used in these photopolymerization processes. The light may emanate from point sources or be in the form of parallel rays or divergent beams. It is preferred to use a broad light source close to the image-bearing transparency from which the relief is to be made. By using a broad light source, relatively close to the image-bearing transparency, the light rays passing through the clear areas of the transparency enter as divergent beams and thus irradiate a continually diverging area in the photopolymerizable layer underneath the clear portions of the transparency, resulting in a polymeric relief having its greatest width at the bottom of the photopolymerized layer, i.e., a frustum, the top surface of the relief being the dimensions of the clear area. Such reliefs are advantageous in printing plates because of their greater strength and smooth sides as contrasted to the undercut or jagged, irregular nature of the sides of photoengraved reliefs. The smooth sloping reliefs so obtained reduce or eliminate ink buildup encountered with photoengraved plates. Inasmuch as the free-radical-generating addition-polymerization initiators activatable by actinic light generally exhibit their maximum sensitivity in the ultraviolet range, the light source should furnish an effective amount of this radiation. Such sources include carbon arcs, mercury-vapor arcs, fluorescent lamps with special ultraviolet-light-emitting phosphors, argon glow lamps, and photographic flood lamps. Of these, the mercury-vapor arcs, particularly the sun-lamp type, and the fluorescent sun-lamps, are most suitable.

The base material used can be any natural or synthetic resin or polymer capable of existence in film or sheet form and can be flexible or rigid, reflective or non-reflective of actinic light. Metals are preferred as the base materials. However, where weight is critical, the synthetic resins or superpolymers, particularly the thermoplastic ones, are desirable base materials. Where rotary press plates are desired, both types of base or support materials can be used to form flat relief plates which are then formed to the desired shape. Rotary press plates can also be prepared by using cylindrically-shaped base plates carrying the photopolymerizable compositions and exposing them directly through a concentrically disposed image-bearing transparency.

Suitable base or support materials include metals, e.g., steel and aluminum plates, sheets and foils, and films or plates composed of various film-forming synthetic resins or high polymers, and in particular the vinylidene polymers. Metal plates because of their strength are preferred.

When highly reflective bases are used, oblique rays passing through clear areas in the image-bearing transparency will strike the surface of the base at an angle other than 90° and after reflection will cause polymerization in non-image areas. This disadvantage can be overcome when the photopolymerizable layer is on a light-reflective base by an intervening stratum sufficiently absorptive of actinic light so that less than 35% of the incident actinic light is reflected. The layer absorptive of reflected light, or antihalation layer, can be made by dispersing a finely-divided dye or pigment which substantially absorbs actinic light in a solution or aqueous dispersion of a resin or polymer which is adherent to both the support and the photopolymerized image and coating it on the support to form an anchor layer which is dried. Suitable antihalation pigments include carbon black, manganese dioxide, dyes, e.g., Acid blue black (Colour Index 246) and Acid magenta O (Colour Index 692). A dyed metal plate is also useful.

The light-absorptive layer intermediate between the photopolymerizable layer and the reinforcing metal base plate should have adequate adhesion to the reinforcing base plate and the photopolymerizable layer and not react with the light-absorptive material. Suitable polymeric or resin carriers for the light-absorptive dyes or pigments which can be used include vinyl halides, e.g., polyvinyl chloride; vinyl copolymers, particularly of vinyl halides, e.g., vinyl chloride with vinyl acetate, diethyl fumarate, ethyl acrylate. Polymer-forming monomers, e.g., acrylic and methacrylic acid, may also be used.

The unsaturated polyamides, e.g., N-acrylyloxymethyl polyamides, used in accordance with this invention, are ordinarily prepared in the presence of a small amount of a thermal addition-polymerization inhibitor, e.g., 0.1% to 0.5% of hydroquinone or di-tert-butyl p-cresol. Also, other polymerizable ethylenically unsaturated compounds (useful in the compositions hereof) which are to be shipped or stored often have added to them a very small proportion, e.g., 0.01% to 0.1% of such inhibitors. Compositions containing these small amounts of inhibitors can be photopolymerized without removal of the inhibitor.

The solvent liquid used for washing or "developing" the plates made from the photopolymerizable compositions of this invention should have good solvent action on the linear N-acrylyloxymethyl polyamide or its mixture with another ethylenically unsaturated component and little action on the hardened image or upon the base material, antihalation layer, or anchor layer in the period required to remove the non-crosslinked portions. Methanol or ethanol or their mixtures with water are advantageous solvents. Best results are obtained when the solvent is warm, e.g., at 30 to 50° C.

The solvent can be applied in any convenient manner, as by pouring, immersion, or spray. Brushing, e.g., with a soft brush, aids in the removal of the unpolymerized portion of the composition.

Photopolymerizable elements suitable for making relief images can carry on the uppermost surface a protective strippable layer and on the reverse surface of the support, a pressure-sensitive adhesive layer provided with a protective strippable layer. Upon the removal of the latter, the element can be pressed onto a permanent support, e.g., a printing block or metal plate.

The printing reliefs made in accordance with this invention can be used in all classes of printing but are most applicable to those classes of printing wherein a distinct difference of height between printing and non-printing areas is required. These classes include those wherein the ink is carried by the raised portion of the relief such as in dry-offset printing, ordinary letterpress printing, the latter requiring greater height differences between printing and non-printing areas, and those wherein the ink is carried by the recessed portions of the relief such as in intaglio printing, e.g., line and inverted halftone. The plates are obviously useful in multicolor printing.

The photopolymerizable compositions of this invention are also suitable for other purposes in which readily insolubilized, solid, addition-polymerizable compositions are useful, such as binders for television phosphors, in producing ornamental effects and plastic articles of various types. They are useful in making multicolor television screens by photopolymerization procedures.

This invention provides photopolymerizable elements and a simple, effective process for producing letterpress printing plates of uniform printing height from relatively inexpensive materials and with a marked reduction in labor requirements over the conventional photoengraving procedure. The images obtained are sharp and show high fidelity to the original transparency both in small details and in overall dimension. The printing reliefs made from an additional ethylenically unsaturated compound have the advantage that they have high impact strength and are not brittle but are exceptionally tough and have unusually long press wear. A further advantage is that they are not affected by printing inks and cleaning solutions; they stand up well during any long solvent contact.

We claim:

1. A photopolymerizable element comprising a support and a layer of a photopolymerizable composition comprising a synthetic linear laterally unsaturated polycarbonamide of a dicarboxylic acid and a diamine having a molecular weight of at least 5000 and containing as an integral part of the main carbon chain recurring intralinear groups of the formula:

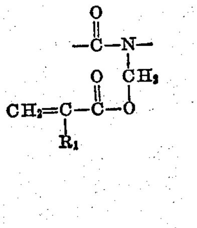

wherein $R_1$ is a member taken from the group consisting of hydrogen, chlorine and alkyl radicals of 1 to 5 carbon atoms, the

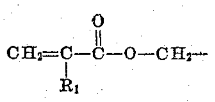

groups being present on at least 2% up to about 42% of the intralinear amido nitrogen atoms, any remaining substituted amido nitrogen atoms being of the formula:

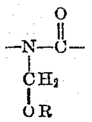

wherein R is an alkyl radical of 1 through 5 carbon atoms, the alkoxymethyl groups being present on from 0 to 43% of the intralinear amido nitrogen atoms, and from 0.01% to 5.0% by weight of the composition of an addition polymerization initiator activatable by actinic light and inactive thermally below 85° C.

2. An element as set forth in claim 1 wherein said support is metal.

3. An element as set forth in claim 1 wherein said polyamide is essentially transparent to actinic light and the intralinear groups have a unit length of at least 7.

4. An element as set forth in claim 1 wherein said polyamide is soluble to the extent of at least 15% by weight in aqueous ethanol containing up to about 30% by weight of water and is insoluble in carbon tetrachloride.

5. An element as set forth in claim 1 wherein $R_1$ is hydrogen.

6. An element as set forth in claim 1 wherein $R_1$ is methyl.

7. An element as set forth in claim 1 wherein said polyamide is a polyhexamethylene adipamide.

8. An element as set forth in claim 1 wherein said polyamide is a polyhexamethylene sebacamide.

9. An element as set forth in claim 1 containing a compatible addition polymerizable ethylenically unsaturated compound in an amount from 1% to 60% by weight of the composition.

10. An element as set forth in claim 1 containing 1 to 60 parts by weight of glycero dimethacrylate.

11. An element as set forth in claim 1 containing 1 to 60 parts by weight of hydroxyethyl methacrylate.

12. An element as set forth in claim 1 containing 1 to 60 parts by weight of bis (2-methacrylamidoethyl) amine.

References Cited in the file of this patent

UNITED STATES PATENTS 2,451,672 Gray ------------------ Oct. 19, 1948

FOREIGN PATENTS

T10743 Germany ------------- Dec. 8, 1955